United States Patent
Kaneda

(10) Patent No.: US 12,114,516 B2
(45) Date of Patent: Oct. 8, 2024

(54) PHOTOELECTRIC CONVERSION ELEMENT, METHOD OF MANUFACTURING THE SAME, SOLID STATE IMAGE SENSOR, ELECTRONIC DEVICE, AND SOLAR CELL

(71) Applicant: SONY SEMICONDUCTOR SOLUTIONS CORPORATION, Kanagawa (JP)

(72) Inventor: Yukio Kaneda, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 17/648,543

(22) Filed: Jan. 20, 2022

(65) Prior Publication Data

US 2022/0149304 A1   May 12, 2022

Related U.S. Application Data

(63) Continuation of application No. 15/773,675, filed as application No. PCT/JP2016/083325 on Nov. 10, 2016, now Pat. No. 11,264,580.

(30) Foreign Application Priority Data

Nov. 24, 2015   (JP) .................. 2015-228427

(51) Int. Cl.
*H10K 30/30*   (2023.01)
*H01L 27/146*   (2006.01)
(Continued)

(52) U.S. Cl.
CPC ......... *H10K 30/353* (2023.02); *H01L 27/146* (2013.01); *H01L 27/1461* (2013.01);
(Continued)

(58) Field of Classification Search
CPC ............. H01L 31/0368; H01L 31/0442; H01L 51/4273; H01L 27/146; H01L 27/1461;
(Continued)

(56) References Cited

U.S. PATENT DOCUMENTS

2007/0063156 A1   3/2007   Hayashi
2009/0266396 A1*  10/2009   Niira ............... H01L 31/182
                                                               136/258
(Continued)

FOREIGN PATENT DOCUMENTS

CN   103107228 A   5/2013
JP   2007-088033 A   4/2007
(Continued)

OTHER PUBLICATIONS

Forrest et al, A Hybrid Planar-Mixed Molecular Heterojunction Photovoltaic cell, Advanced Materials, 2006, vol. 17 No. 3 pp. 66-70.*
(Continued)

*Primary Examiner* — Michael Y Sun
(74) *Attorney, Agent, or Firm* — CHIP LAW GROUP

(57) ABSTRACT

The present technology relates to, in a photoelectric conversion element using a photoelectric conversion film, the photoelectric conversion element and a method of manufacturing the same, a solid state image sensor, an electronic device, and a solar cell, for enabling improvement of quantum efficiency. The photoelectric conversion element includes two electrodes constituting an anode and a cathode, and a photoelectric conversion layer arranged between the two electrodes, and at least one electrode side of the two electrodes is doped with an impurity at impurity density of 1e16/cm3 or more in the photoelectric conversion layer. The
(Continued)

present technology can be applied to, for example, a solid state image sensor, an electronic device, a solar cell and the like.

11 Claims, 11 Drawing Sheets

(51) Int. Cl.
*H10K 30/82* (2023.01)
*H10K 39/32* (2023.01)

(52) U.S. Cl.
CPC .. *H01L 27/14643* (2013.01); *H01L 27/14645* (2013.01); *H01L 27/14667* (2013.01); *H10K 30/82* (2023.02); *H10K 39/32* (2023.02); *H01L 27/14665* (2013.01); *Y02E 10/549* (2013.01); *Y02P 70/50* (2015.11)

(58) Field of Classification Search
CPC ......... H01L 27/14643; H01L 27/14645; H01L 27/14667; H01L 27/14665; H10K 30/353; H10K 30/82; H10K 39/32; Y02E 10/549; Y02P 70/50

See application file for complete search history.

(56) References Cited

U.S. PATENT DOCUMENTS

| | | | |
|---|---|---|---|
| 2012/0075013 A1* | 3/2012 | Leo | H01L 29/866 257/40 |
| 2013/0119374 A1 | 5/2013 | Kataishi et al. | |
| 2014/0027732 A1* | 1/2014 | Pyo | H10K 59/35 257/40 |
| 2015/0263203 A1* | 9/2015 | Lewis | H01L 51/426 438/63 |
| 2015/0357591 A1* | 12/2015 | Karunadasa | H10K 30/30 438/82 |
| 2018/0016456 A1 | 1/2018 | Wang et al. | |

FOREIGN PATENT DOCUMENTS

| | | |
|---|---|---|
| JP | 2013-123043 A | 6/2013 |
| JP | 2014-107465 A | 6/2014 |

OTHER PUBLICATIONS

International Search Report and Written Opinion of PCT Application No. PCT/JP2016/083325, issued on Jan. 24, 2017, 08 pages of English Translation and 07 pages of ISRWO.
Notice of Allowance for U.S. Appl. No. 15/773,675, issued on Oct. 20, 2021, 8 pages.
Advisory Action for U.S. Appl. No. 15/773,675, issued on Jun. 23, 2021, 3 pages.
Advisory Action for U.S. Appl. No. 15/773,675, issued on Aug. 17, 2020, 3 pages.
Non-Final Office Action for U.S. Appl. No. 15/773,675, issued on Oct. 7, 2020, 8 pages.
Non-Final Office Action for U.S. Appl. No. 15/773,675, issued on Nov. 29, 2019, 8 pages.
Final Office Action for U.S. Appl. No. 15/773,675, issued on Apr. 15, 2021, 8 pages.
Final Office Action for U.S. Appl. No. 15/773,675, issued on Jun. 1, 2020, 9 pages.
International Preliminary Report on Patentability of PCT Application No. PCT/JP2016/083325, issued on Jun. 7, 2018, 08 pages of English Translation and 04 pages of IPRP.

\* cited by examiner

LIGHT

LIGHT

PHOTOELECTRIC CONVERSION ELEMENT, METHOD OF MANUFACTURING THE SAME, SOLID STATE IMAGE SENSOR, ELECTRONIC DEVICE, AND SOLAR CELL

CROSS REFERENCE TO RELATED APPLICATIONS

The present application is a continuation application of U.S. patent application Ser. No. 15/773,675, filed on May 4, 2018 which is a U.S. National Phase of International Patent Application No. PCT/JP2016/083325 filed on Nov. 10, 2016, which claims priority benefit of Japanese Patent Application No. JP 2015-228427 filed in the Japan Patent Office on Nov. 24, 2015. Each of the above-referenced applications is hereby incorporated herein by reference in its entirety.

TECHNICAL FIELD

The present technology relates to a photoelectric conversion element and a method of manufacturing the same, a solid state image sensor, an electronic device, and a solar cell, and particularly relates to a photoelectric conversion element and a method of manufacturing the same, a solid state image sensor, an electronic device, and a solar cell for enabling improvement of quantum efficiency.

BACKGROUND ART

In recent years, solar cells, solid state image sensors, and the like using organic semiconductors as photoelectric conversion films have been developed. A typical structure of a photoelectric conversion element using a photoelectric conversion film is an element structure including a photoelectric conversion film and electrodes sandwiching the photoelectric conversion film from above and below, and in which at least one of the upper and lower electrodes is separated for each pixel. To improve the quantum efficiency in an organic photoelectric conversion element, a technique for increasing the number of charge separation sites has been proposed. As a representative example, there is a film structure in which an electron donating material and an electron accepting material are mixed (bulk heterojunction structure).

For the bulk heterojunction structure, methods for increasing the quantum efficiency have been proposed. For example, in Patent Documents 1 and 2, a composition ratio between an electron donating material and an electron accepting material in a bulk heterojunction structure is sequentially changed in a depth direction, thereby to improve the carrier extraction efficiency after separation.

CITATION LIST

Patent Document

Patent Document 1: Japanese Patent Application Laid-Open No. 2011-54869
Patent Document 2: Japanese Patent Application Laid-Open No. 2006-73856

SUMMARY OF THE INVENTION

Problems to be Solved by the Invention

Typically, an interface between the electron donating material and the electron accepting material serves as the charge separation site in the organic semiconductor, the realization methods in Patent Documents 1 and 2 have a possibility to decrease the number of charge separation sites and conversely lowering the quantum efficiency.

The present technology has been made in view of the foregoing, and the present technology enables improvement of the quantum efficiency in a photoelectric conversion element using a photoelectric conversion film.

Solutions to Problems

A photoelectric conversion element of a first aspect of the present technology includes two electrodes constituting an anode and a cathode, and a photoelectric conversion layer arranged between the two electrodes, in which at least one electrode side of the two electrodes is doped with an impurity at impurity density of $1e16/cm3$ or more in the photoelectric conversion layer.

A method of manufacturing a photoelectric conversion element of a second aspect of the present technology includes forming two electrodes constituting an anode and a cathode, and a photoelectric conversion layer arranged between the two electrodes, and doping at least one electrode side of the two electrodes with an impurity at impurity density of $1e16/cm3$ or more in forming the photoelectric conversion layer.

A solid state image sensor of a third aspect of the present technology includes a photoelectric conversion element including two electrodes constituting an anode and a cathode, and a photoelectric conversion layer arranged between the two electrodes, and at least one electrode side of the two electrodes being doped with an impurity at impurity density of $1e16/cm3$ or more in the photoelectric conversion layer.

An electronic device of a fourth aspect of the present technology includes a photoelectric conversion element including two electrodes constituting an anode and a cathode, and a photoelectric conversion layer arranged between the two electrodes, and at least one electrode side of the two electrodes being doped with an impurity at impurity density of $1e16/cm3$ or more in the photoelectric conversion layer.

A solar cell of a fifth aspect of the present technology includes a photoelectric conversion element including two electrodes constituting an anode and a cathode, and a photoelectric conversion layer arranged between the two electrodes, and at least one electrode side of the two electrodes being doped with an impurity at impurity density of $1e16/cm3$ or more in the photoelectric conversion layer.

In the first to fifth aspects of the present technology, in the photoelectric conversion layer arranged between the two electrodes constituting an anode and a cathode, at least one electrode side of the two electrodes is doped with the impurity at impurity density of $1e16/cm3$ or more.

The photoelectric conversion element, the solid state image sensor, the electronic device, and the solar cell may be independent devices or may be modules incorporated in another device.

Effects of the Invention

According to the first to fifth aspects of the present technology, the quantum efficiency can be improved in a photoelectric conversion element using a photoelectric conversion film.

Note that effects described here are not necessarily limited, and any of effects described in the present disclosure may be exhibited.

MODE FOR CARRYING OUT THE INVENTION

Hereinafter, embodiments for implementing the present technology (hereinafter, embodiments) will be described. Note that the description will be given in the following order.

1. A first embodiment of a photoelectric conversion element (an example having a photoelectric conversion layer doped with electron accepting impurities)
2. A second embodiment of a photoelectric conversion element (an example having a photoelectric conversion layer doped with electron donating impurities)
3. A third embodiment of a photoelectric conversion element (an example having a hole blocking layer)
4. A fourth embodiment of a photoelectric conversion element (an example having an electron blocking layer)
5. A fifth embodiment of a photoelectric conversion element (an example having a photoelectric conversion layer doped with electron accepting impurities and a photoelectric conversion element doped with electron donating impurities)
6. An embodiment of a solid state image sensor
7. A method of manufacturing a photoelectric conversion element
8. Application examples to an electronic device

1. First Embodiment of Photoelectric Conversion Element

Figure 1:
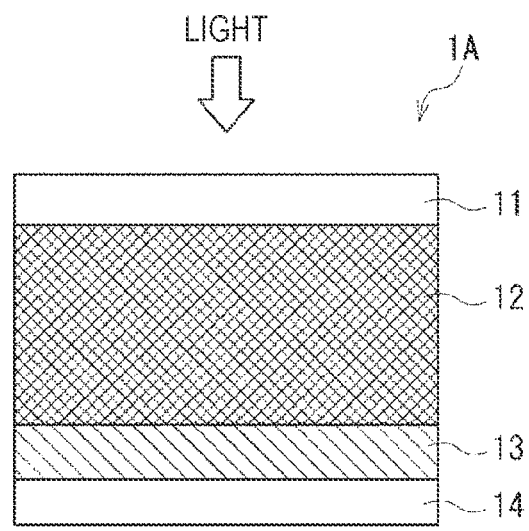
FIG. 1 is a cross section structural view of a first embodiment of a photoelectric conversion element to which the present technology is applied.

FIG. 1 illustrates a cross section structure of a photoelectric conversion element 1A as a first embodiment of a photoelectric conversion element 1 to which the present technology is applied.

The photoelectric conversion element 1A in FIG. 1 is constituted by a laminated structure of an upper electrode 11, a first photoelectric conversion layer 12, a second photoelectric conversion layer 13, and a lower electrode 14.

In the first photoelectric conversion layer 12 and the second photoelectric conversion layer 13, electrons photoelectrically converted from light and holes are collected by the upper electrode 11 or the lower electrode 14. In FIG. 1, for example, the light is radiated from a side of the upper electrode 11, and a potential of the upper electrode 11 is set to be higher than a potential of the lower electrode 14. In this case, the upper electrode 11 serves as an anode and the lower electrode 14 serves as a cathode. The photoelectrically converted electrons are collected by the upper electrode 11 that is the anode, and the holes are collected by the lower electrode 14 that is the cathode.

The upper electrode 11 and the lower electrode 14 include, for example, an indium tin oxide (ITO) film, an indium zinc oxide film, or the like.

The first photoelectric conversion layer 12 is a film that photoelectrically converts the absorbed light, and is a layer in which an electron donating material and an electron accepting material are mixed. The electron donating material and the electron accepting material are photoelectric conversion materials, and are materials in which light absorption and carrier transfer are performed. The electron donating material is also called electron donating compound, electron donor, N-type material, or the like. The electron accepting material is also called electron accepting compound, electron acceptor, P-type material, or the like.

Examples of the electron donating material include amine compounds typified by N,N'-bis(3-tolyl)-N,N'-diphenylbenzidine (mTPD), N,N'-dinaphthyl-N,N'-diphenylbenzidine (NPD), 4,4',4"-tris(phenyl-3-tolylamino)triphenylamine (MTDATA), and the like, phthalocyanines typified by phthalocyanine (Pc), copper phthalocyanine (CuPc), zinc phthalocyanine (ZnPc), titanyl phthalocyanine (TiOPc) and the like and porphyrins typified by octaethylporphyrin (OEP), platinum octaethylporphyrin (PtOEP), zinc tetraphenylporphyrin (ZNTPP) and the like. Further, in the case of a polymer compound using a solution coating process, examples include main chain-type conjugated polymers typified by methoxyethylhexyloxyphenylenevinylene (MEHPPV), polyhexylthiophene (P3HT), cyclopentadithiophene-benzothiadiazole (PCPDTBT), and the like and side chain-type polymers typified by polyvinylcarbazole and the like.

Examples of the electron accepting material include organic compounds such as fullerene derivatives such as C60 and C70, a carbon nanotube, a perylene derivative, polycyclic quinone, and quinacridone, and polymer systems such as CN-poly(phenylene-vinylene), MEH-CN-PPV, polymers containing —CN group or —CF3 group, and a poly(fluorene) derivative. Note that materials having small electron affinity are favorable. A sufficient open-end voltage can be realized by combining a material having small electron affinity as an N layer.

The second photoelectric conversion layer 13 is a layer doped with electron accepting impurities at impurity density of 1e16/cm3 ($1.0 \times 10^{16}$/cm3) or more, in addition to the material constituting the first photoelectric conversion layer 12. The electron accepting impurities and the electron donating impurities described below are dopants and have a function to change the potential by being present as fixed charges in the film. The electron accepting impurities and the electron donating impurities themselves do not perform the light absorption and the carrier transfer. The electron accepting impurities are acceptors and the electron donating impurities are donors.

Examples of doping electron accepting impurities include organic substances such as F4-TCNQ and DBC (dibenzo 18-crown-6 ether), and inorganic materials such as MoO3 and V2O5. There is no particular limitation on the thickness of the first photoelectric conversion layer 12 and the second photoelectric conversion layer 13. However, the thickness of the second photoelectric conversion layer 13 is favorably equal to or less than 40% of the thickness of the first photoelectric conversion layer 12. Further, the electron accepting impurity density is favorably 1e17/cm3, and more favorably 1e18/cm3 or more.

Figure 2:
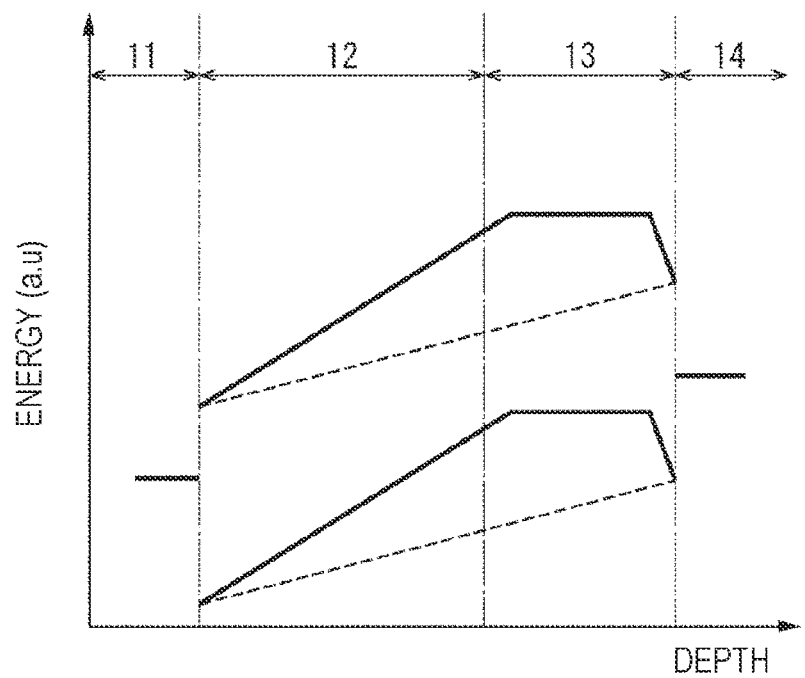
FIG. 2 is an energy diagram of the photoelectric conversion element of FIG. 1.

FIG. 2 is an energy diagram of the photoelectric conversion element 1A.

The energy profile illustrated by the solid line in FIG. 2 represents an energy profile of the photoelectric conversion element 1A, and the energy profile illustrated by the broken line represents an energy profile of a case where the second photoelectric conversion layer 13 is not doped with the electron accepting impurities.

The energy profile of the photoelectric conversion element 1A is convex upward as illustrated in FIG. 2 as the second photoelectric conversion layer 13 is doped with the electron accepting impurities. With the profile, an electric field strongly acts on the first photoelectric conversion layer 12, and the transfer of electrons and holes generated by photoelectric conversion is facilitated and the quantum efficiency can be improved.

Further, in the case of using the photoelectric conversion element 1A as a photoelectric conversion portion of a solid state image sensor, an ionization potential of the second photoelectric conversion layer 13 becomes relatively high (the distance from a vacuum order becomes shallow), whereby electron injection from the lower electrode 14 can be suppressed and a dark current to be a noise can be reduced.

2. Second Embodiment of Photoelectric Conversion Element

Figure 3:
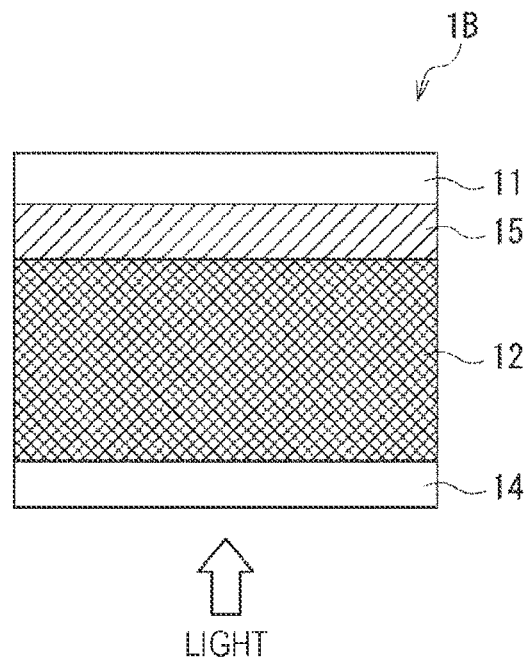
FIG. 3 is a cross section structural view of a second embodiment of a photoelectric conversion element to which the present technology is applied.

FIG. 3 illustrates a cross section structure of a photoelectric conversion element 1B as a second embodiment of the photoelectric conversion element 1 to which the present technology is applied.

In FIG. 3, the same reference numeral is given to a portion corresponding to the above-described first embodiment, and the description thereof is omitted as appropriate.

The photoelectric conversion element 1B in FIG. 3 is constituted by a laminated structure of an upper electrode 11, a third photoelectric conversion layer 15, a first photoelectric conversion layer 12, and a lower electrode 14.

That is, in the second embodiment, the upper electrode 11, the first photoelectric conversion layer 12, and the lower electrode 14 are similarly configured to the first embodiment. Then, in the second embodiment, the second photoelectric conversion layer 13 of the first embodiment is omitted, and instead, the third photoelectric conversion layer 15 is provided between the upper electrode 11 and the first photoelectric conversion layer 12.

Note that, in the second embodiment, light is radiated from a side of the lower electrode 14.

The third photoelectric conversion layer 15 is a layer doped with electron donating impurities at impurity density of 1e16/cm3 or more, in addition to the material constituting the first photoelectric conversion layer 12. Examples of doping electron donating impurities include organic substances such as Ru(terpy)2, inorganic substances such as Cs2CO3, and alkali metals such as Li. There is no particular limitation on the thickness of the first photoelectric conversion layer 12 and the third photoelectric conversion layer 15. However, the thickness of the third photoelectric conversion layer 15 is favorably equal to or less than 40% of the thickness of the first photoelectric conversion layer 12. Further, the electron donating impurity density is favorably 1e17/cm3, and more favorably 1e18/cm3 or more.

Figure 4:
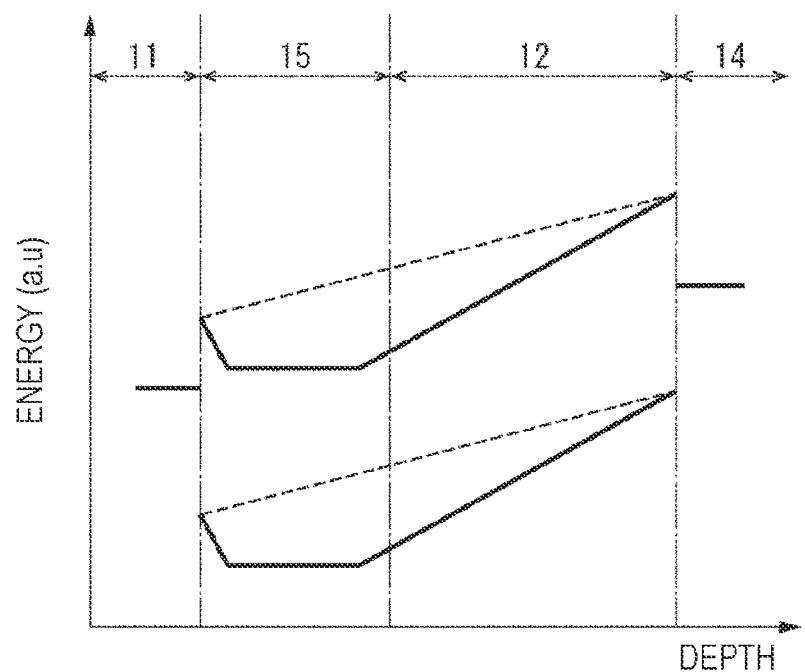
FIG. 4 is an energy diagram of the photoelectric conversion element of FIG. 3.

FIG. 4 is an energy diagram of the photoelectric conversion element 1B.

The energy profile illustrated by the solid line in FIG. 4 represents an energy profile of the photoelectric conversion element 1B, and the energy profile illustrated by the broken line represents an energy profile of a case where the third photoelectric conversion layer 15 is not doped with the electron donating impurities.

The energy profile of the photoelectric conversion element 1B is convex downward as illustrated in FIG. 4 as the third photoelectric conversion layer 15 is doped with the electron donating impurities. With the profile, an electric field strongly acts on the first photoelectric conversion layer 12, and the transfer of electrons and holes generated by photoelectric conversion is facilitated and the quantum efficiency can be improved.

Further, in the case of using the photoelectric conversion element 1B as a photoelectric conversion portion of a solid state image sensor, an ionization potential of the third photoelectric conversion layer 15 becomes relatively low (the distance from a vacuum order becomes deep), whereby hole injection from the upper electrode 11 can be suppressed and a dark current to be a noise can be reduced.

3. Third Embodiment of Photoelectric Conversion Element

Figure 5:
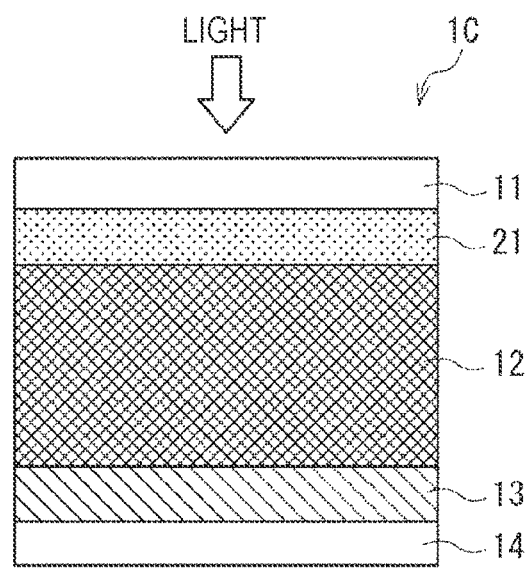
FIG. 5 is a cross section structural view of a third embodiment of a photoelectric conversion element to which the present technology is applied.

FIG. 5 illustrates a cross section structure of a photoelectric conversion element 1C as a third embodiment of the photoelectric conversion element 1 to which the present technology is applied.

In the third embodiment, description of portions denoted by the same reference numerals as the above-described first embodiment is omitted as appropriate.

The photoelectric conversion element 1C in FIG. 5 is constituted by a laminated structure of an upper electrode 11, a hole blocking layer 21, a first photoelectric conversion layer 12, a second photoelectric conversion layer 13, and a lower electrode 14. That is, the photoelectric conversion element 1C of the third embodiment has a configuration in which the hole blocking layer 21 is added between the upper electrode 11 and the first photoelectric conversion layer 12 of the photoelectric conversion element 1A of the first embodiment.

For the hole blocking layer 21, an electron accepting organic material can be used. As the electron accepting organic material, C60 and C70 and other fullerenes, a carbon nanotube, and derivatives thereof, oxadiazole derivatives such as 1,3-bis(4-tert-butylphenyl-1,3,4-oxadiazolyl)phenylene (OXD-7), an anthraquinodimethane derivative, a diphenylquinone derivative, bathocuproine, bathophenanthroline, and derivatives thereof, a triazole compound, a tris(8-hydroxyquinolinate)aluminum complex, a bis(4-methyl-8-quinolinato)aluminum complex, a distyrylarylene derivative, a silole compound, or the like can be used. The thickness of the hole blocking layer 21 is from 10 to 200 nm, both inclusive, more favorably from 30 to 150 nm, both inclusive, and more particularly favorably from 50 to 100 nm, both inclusive.

In the case of using the photoelectric conversion element 1 as a photoelectric conversion portion of a solid state image sensor, a voltage is often applied from the outside to improve the photoelectric conversion efficiency and the response speed. However, in such a case, a dark current due to hole injection or electron injection from an electrode is increased due to an external electric field. If the dark current is increased more than the rise of the photoelectric conversion efficiency due to the external voltage, an S/N ratio is decreased.

The photoelectric conversion element 1C is provided with the hole blocking layer 21, thereby to block the hole injection from the upper electrode 11. As a result, a photoelectric conversion element with low noise can be provided.

Figure 6:
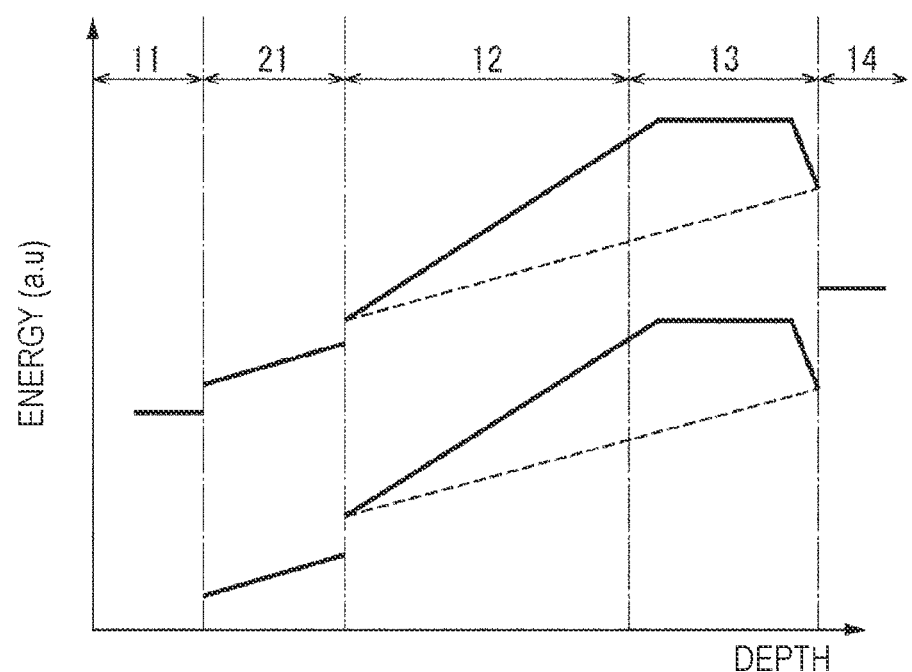
FIG. 6 is an energy diagram of the photoelectric conversion element of FIG. 5.

FIG. 6 is an energy diagram of the photoelectric conversion element 1C.

As illustrated in FIG. 6, the hole blocking layer 21 desirably has deeper highest occupied molecular orbital (HOMO) than the first photoelectric conversion layer 12 and desirably has equal or deeper lowest unoccupied molecular orbital (LUMO) than LUMO of the first photoelectric conversion layer 12 from the viewpoint of the quantum efficiency and the responsiveness, and is favorably transparent.

4. Fourth Embodiment of Photoelectric Conversion Element

Figure 7:
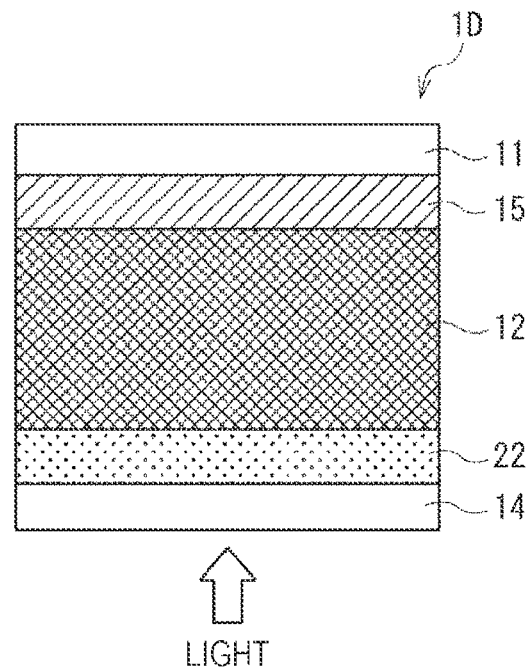
FIG. 7 is a cross section structural view of a fourth embodiment of a photoelectric conversion element to which the present technology is applied.

FIG. 7 illustrates a cross section structure of a photoelectric conversion element 1D as a fourth embodiment of the photoelectric conversion element 1 to which the present technology is applied.

In the fourth embodiment, description of portions denoted by the same reference numerals as the above-described second embodiment is omitted as appropriate.

The photoelectric conversion element 1D in FIG. 7 is constituted by a laminated structure of an upper electrode 11, a third photoelectric conversion layer 15, a first photoelectric conversion layer 12, an electron blocking layer 22, and a lower electrode 14. That is, the photoelectric conversion element 1D of the fourth embodiment has a configuration in which the electron blocking layer 22 is added between the first photoelectric conversion layer 12 and the lower electrode 14 of the photoelectric conversion element 1B of the second embodiment.

For the electron blocking layer 22, an electron donating organic material can be used. As the electron donating organic material, for example, an aromatic diamine compound such as N, N'-bis(3-methylphenyl)-(1,1'-biphenyl)-4, 4'-diamine (TPD) or 4,4'-bis [N-(naphthyl)-N-phenylamino]biphenyl (α-NPD), a porphyrin compound such as oxazole, oxadiazole, triazole, imidazole, imidazolone, a stilbene derivative, a pyrazoline derivative, tetrahydroimidazole, polyarylalkane, butadiene, 4,4',4"-tris(N-(3-methylphenyl)N-phenylamino)triphenylamine (m-MTDATA), porphine, tetraphenylporphine copper, phthalocyanine, copper phthalocyanine, or titanium phthalocyanine oxide, a triazole derivative, an oxadizazole derivative, an imidazole derivative, a polyarylalkane derivative, a pyrazoline derivative, a pyrazolone derivative, a phenylene diamine derivative, an annealed amine derivative, an amino substituted chalcone derivative, an oxazole derivative, a styrylanthracene derivative, a fluorenone derivative, a hydrazone derivative, a silazane derivative, or the like can be used. As a polymeric material, a polymer such as phenylenevinylene, fluorene, carbazole, indole, pyrene, pyrrole, picoline, thiophene, acetylene, or diacetylene, or a derivative thereof can be used. The thickness of the electron blocking layer 22 is from 10 to 200 nm, both inclusive, more favorably from 30 to 150 nm, both inclusive, and more particularly favorably from 50 to 100 nm, both inclusive.

The photoelectric conversion element 1D is provided with the electron blocking layer 22, thereby to block the electron injection from the lower electrode 14. As a result, a photoelectric conversion element with low noise can be provided.

Figure 8:
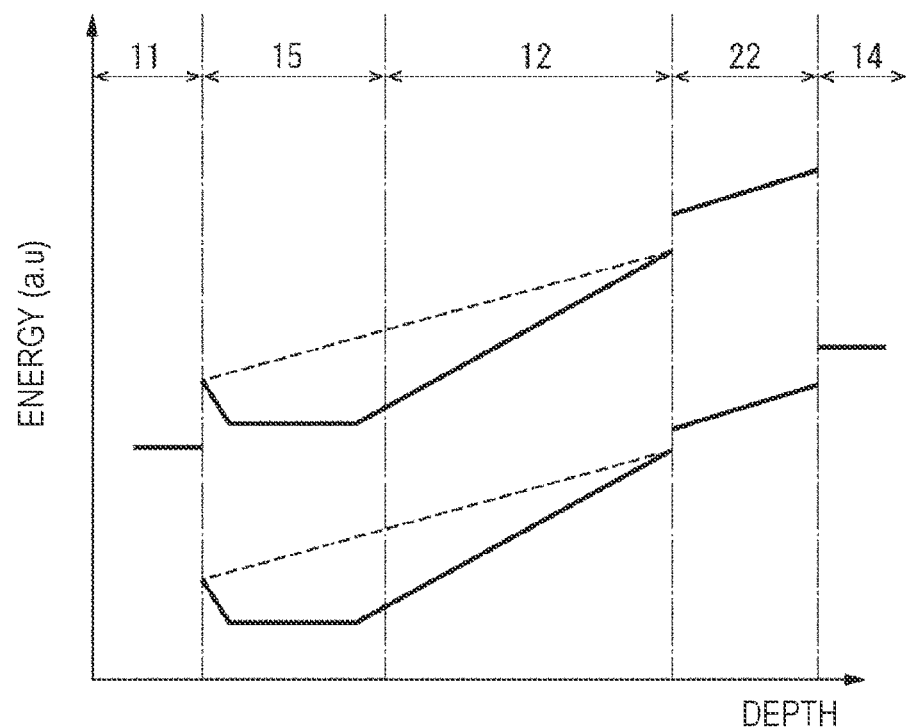
FIG. 8 is an energy diagram of the photoelectric conversion element of FIG. 7.

FIG. 8 is an energy diagram of the photoelectric conversion element 1D.

As illustrated in FIG. 8, the electron blocking layer 22 desirably has shallower LUMO than LUMO of the first photoelectric conversion layer 12 and desirably has equal or deeper HOMO than HOMO of the first photoelectric conversion layer 12 from the viewpoint of the quantum efficiency and the responsiveness, and is favorably transparent. The above-described third embodiment has a configuration in which the hole blocking layer 21 is added to the photoelectric conversion element structure of the first embodiment, and the fourth embodiment has a configuration in which the electron blocking layer 22 is added to the photoelectric conversion element structure of the second embodiment.

However, configurations in which the hole blocking layer 21 to be added and the electron blocking layer 22 to be added are switched, that is, a configuration in which the electron blocking layer 22 is added to the photoelectric conversion element structure of the first embodiment and the hole blocking layer 21 is added to the photoelectric conversion element structure of the second embodiment can be employed.

Figure 9:
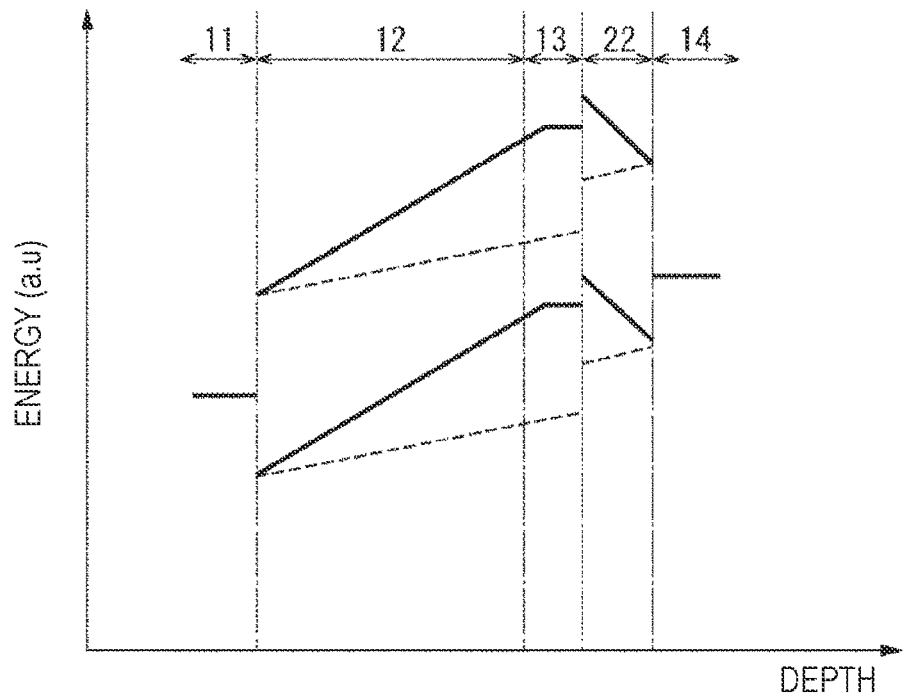
FIG. 9 is an energy diagram of a photoelectric conversion element of a modification of the third embodiment.

The energy diagram of the configuration in which the electron blocking layer 22 is added to the photoelectric conversion element structure of the first embodiment (a modification of the third embodiment) is as illustrated in FIG. 9. The electron blocking layer 22 is inserted between the second photoelectric conversion layer 13 and the lower electrode 14.

Figure 10:
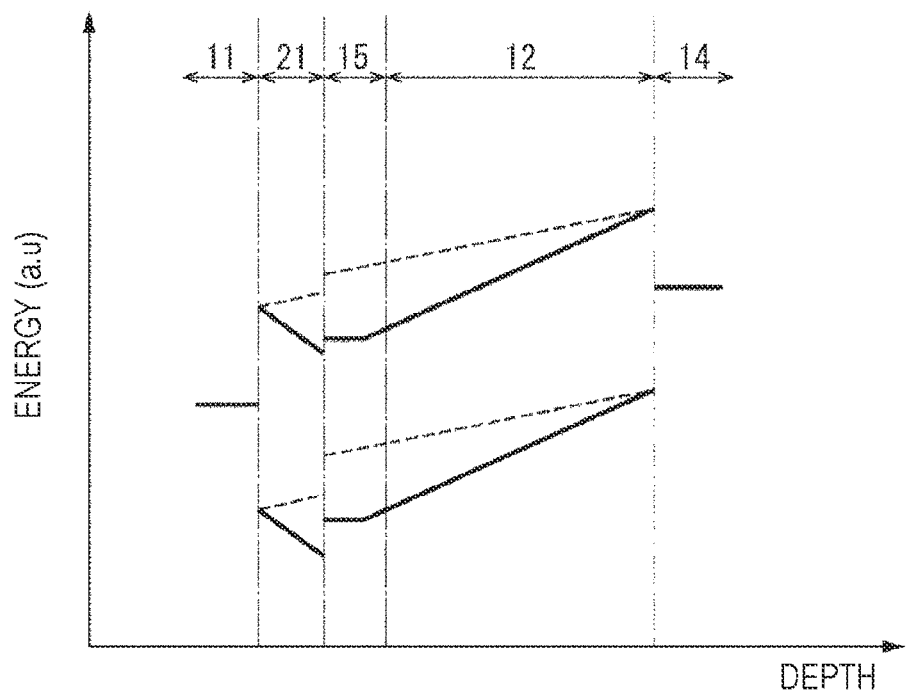
FIG. 10 is an energy diagram of a photoelectric conversion element of a modification of the fourth embodiment.

The energy diagram of the configuration in which the hole blocking layer 21 is added to the photoelectric conversion element structure of the second embodiment (a modification of the fourth embodiment) is as illustrated in FIG. 10. The hole blocking layer 21 is inserted between the upper electrode 11 and the third photoelectric conversion layer 15.

In the modifications of the third and fourth embodiments, the dark current to be a noise can be further reduced by insertion of the hole blocking layer 21 or the electron blocking layer 22.

5. Fifth Embodiment of Photoelectric Conversion Element

Figure 11:
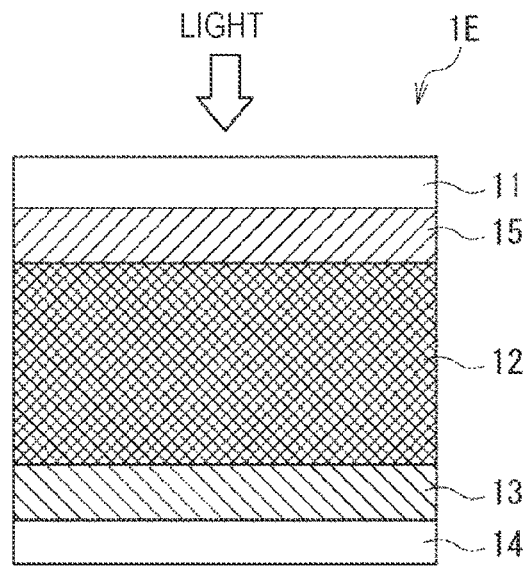
FIG. 11 is a cross section structural view of a fifth embodiment of a photoelectric conversion element to which the present technology is applied.

FIG. 11 illustrates a cross section structure of a photoelectric conversion element 1E as a fifth embodiment of the photoelectric conversion element 1 to which the present technology is applied.

In the fifth embodiment, description of portions denoted by the same reference numerals as the above-described first to fourth embodiments is omitted as appropriate.

The photoelectric conversion element 1E in FIG. 11 is constituted by a laminated structure of an upper electrode 11, a third photoelectric conversion layer 15, a first photoelectric conversion layer 12, a second photoelectric conversion layer 13, and a lower electrode 14. That is, the photoelectric conversion element 1E of the fifth embodiment has a configuration in which the third photoelectric conversion layer 15 is also added between the upper electrode 11 and the first photoelectric conversion layer 12 of the photoelectric conversion element 1A of the first embodiment. Light is radiated from a side of the upper electrode 11, similarly to the first embodiment.

Figure 12:
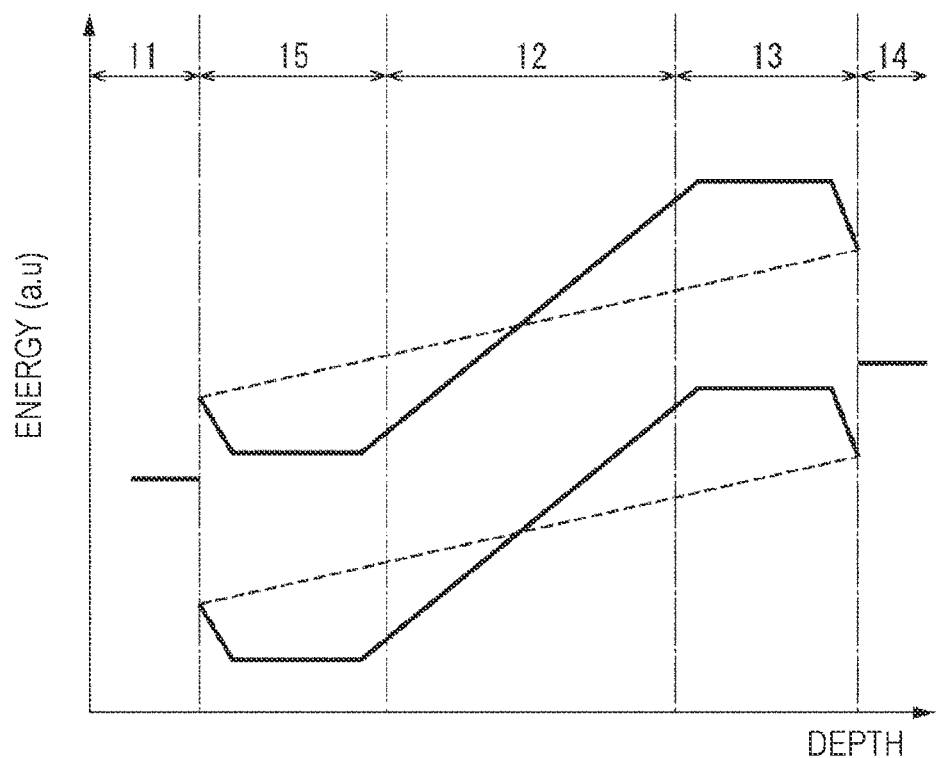
FIG. 12 is an energy diagram of the photoelectric conversion element of FIG. 9.

FIG. 12 is an energy diagram of the photoelectric conversion element 1E.

The energy profile illustrated by the solid line in FIG. 12 represents an energy profile of the photoelectric conversion element 1E, and the energy profile illustrated by the broken line represents an energy profile of a case where the second photoelectric conversion layer 13 is not doped with the electron accepting impurities and the third photoelectric conversion layer 15 is not doped with the electron donating impurities.

The energy profile of the photoelectric conversion element 1E illustrates steep energy change of the first photoelectric conversion layer 12 with respect to a depth direction as the second photoelectric conversion layer 13 and the third photoelectric conversion layer 15 are respectively doped with the electron accepting impurities and the electron donating impurities. With the profile, an electric field strongly acts on the first photoelectric conversion layer 12, and the transfer of electrons and holes generated by photoelectric conversion is facilitated and the quantum efficiency can be improved.

In the case of using the photoelectric conversion element 1E as a photoelectric conversion portion of a solid state image sensor, an ionization potential of the second photoelectric conversion layer 13 becomes relatively high, whereby electron injection from the lower electrode 14 can be suppressed and noise is reduced. Further, an ionization potential of the third photoelectric conversion layer 15 becomes relatively low, whereby hole injection from the upper electrode 11 can be suppressed and noise is reduced.

Alternatively, although a cross section structural view is omitted, the hole blocking layer 21 may be further added between the upper electrode 11 and the third photoelectric conversion layer 15 of the photoelectric conversion element 1E illustrated in FIG. 11, and the electron blocking layer 22 may be further added between the second photoelectric conversion layer 13 and the lower electrode 14. Alternatively, one of the hole blocking layer 21 and the electron blocking layer 22 may be added to the configuration of the photoelectric conversion element 1E illustrated in FIG. 11.

Figure 13:
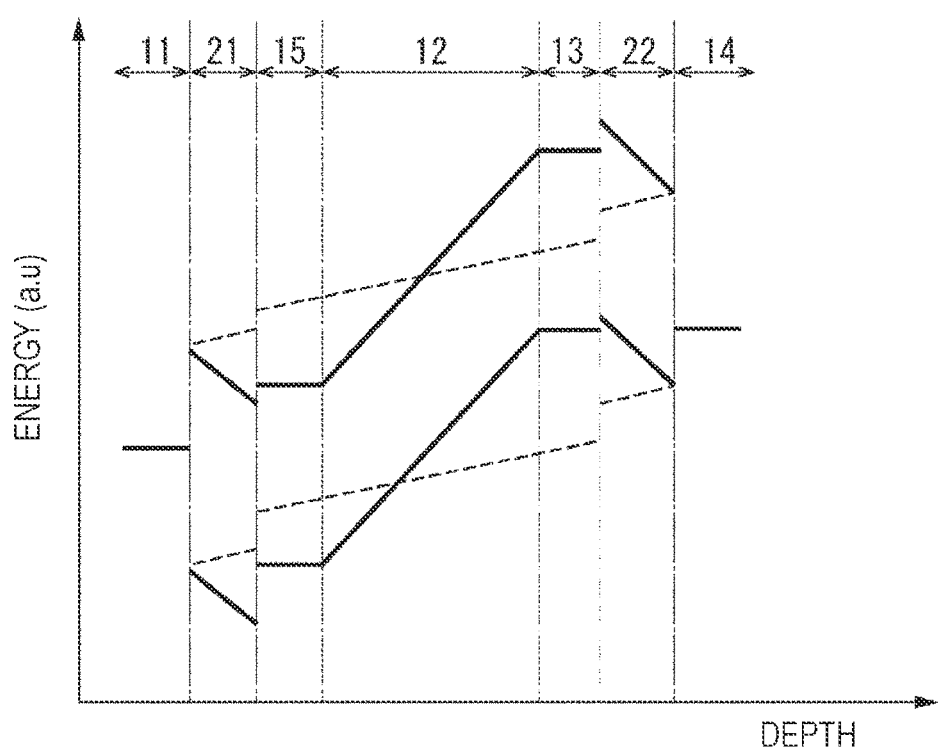
FIG. 13 is an energy diagram of a photoelectric conversion element of a modification of the fifth embodiment.

FIG. 13 illustrates an energy diagram of the configuration in which the hole blocking layer 21 and the electron blocking layer 22 are added to the configuration of the photoelectric conversion element 1E illustrated in FIG. 11.

A photoelectric conversion element with smaller noise can be provided by blocking the hole injection from the upper electrode 11 by addition of the hole blocking layer 21. A photoelectric conversion element with smaller noise can be provided by blocking the electron injection from the lower electrode 14 by addition of the electron blocking layer 22.

6. Embodiment of Solid State Image Sensor

Next, a configuration example of a solid state image sensor using the above-described photoelectric conversion element 1 as a photoelectric conversion portion will be described.

Figure 14:
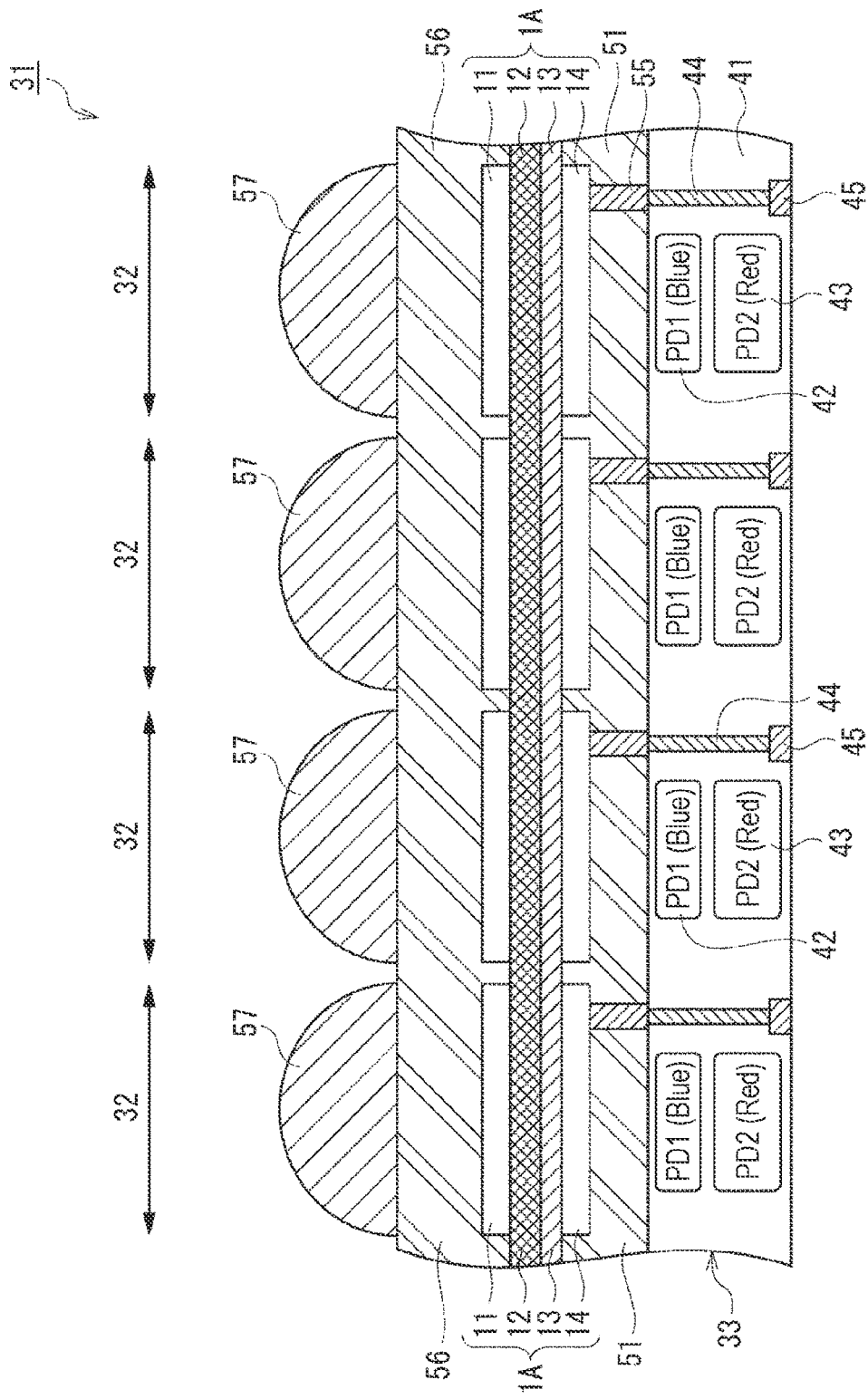
FIG. 14 is a sectional view of a solid state image sensor using the photoelectric conversion element of FIG. 1 as a photoelectric conversion portion.

FIG. 14 is a sectional view of a solid state image sensor 31 using the above-described photoelectric conversion element 1 as a photoelectric conversion portion.

Note that FIG. 14 is particularly a sectional view of a pixel array unit in which pixels 32 are two-dimensionally arranged in a matrix manner, of the solid state image sensor 31, and illustrates an example of adopting the configuration of the photoelectric conversion element 1A of the first embodiment as the photoelectric conversion element 1.

In a first conductivity-type (for example, P-type) semiconductor region 41 of a semiconductor substrate 33, second conductivity-type (for example, N-type) semiconductor regions 42 and 43 are laminated in a depth direction, whereby photodiodes PD1 and PD2 by PN junction are formed in the depth direction. The photodiode PD1 having the semiconductor region 42 as a charge accumulation region is a photoelectric conversion portion that receives blue light and performs photoelectric conversion, and the photodiode PD2 having the semiconductor region 43 as a charge accumulation region is a photoelectric conversion portion that receives red light and performs photoelectric conversion.

A plurality of pixel transistors for reading out electric charges accumulated in the photodiodes PD1 and PD2, for example, and a multilayer wiring layer including a plurality of wiring layers and an interlayer insulating film are formed on a front surface side (lower side in FIG. 14) of the semiconductor substrate 33 although illustration is omitted in FIG. 14.

A conductive plug 44 for taking out electric charges photoelectrically converted by the photoelectric conversion element 1A to a substrate surface side (lower side in FIG. 14) is formed in the semiconductor substrate 33 to penetrate (the semiconductor region 41 of) the semiconductor substrate 33. Note that, although not illustrated, an outer periphery of the conductive plug 44 is insulated with an insulating film of SiO2, SiN, or the like.

The conductive plug 44 is connected to a charge holding portion 45 including the second conductivity-type (for example, the N-type) semiconductor region in the semiconductor region 41. The charge holding portion 45 temporarily holds the electric charge photoelectrically converted by the photoelectric conversion element 1A until the electric charge is read out.

A transparent insulating film 51 including two or three layers of, for example, a hafnium oxide (HfO2) film and a silicon oxide film is formed at an interface on a back side (the upper side in FIG. 14) of the semiconductor substrate 33.

The photoelectric conversion element 1A illustrated in FIG. 1 is arranged on an upper side of the transparent insulating film 51. The photoelectric conversion element 1A photoelectrically converts green wavelength light. In a first photoelectric conversion layer 12 and a second photoelectric conversion layer 13, an example of a combination of an electron donating material and an electron accepting material having sensitivity only to green includes a combination of an organic material containing a quinacridone compound (electron donating material) and a perylene compound (electron accepting material).

Further, in the case where the first photoelectric conversion layer 12 and the second photoelectric conversion layer 13 are photoelectric conversion films having sensitivity only to red, an example of the combination of an electron donating material and an electron accepting material film includes a combination of an organic material containing a phthalocyanine compound (electron donating material) and a fluorine substituted phthalocyanine compound (electron accepting material).

In the case where the first photoelectric conversion layer 12 and the second photoelectric conversion layer 13 are photoelectric conversion films having sensitivity only to blue, an example of the combination of an electron donating material and an electron accepting material film includes a combination of an organic material containing a coumarin compound (electron donating material) and a silole compound (electron accepting material).

In the example of FIG. 14, both an upper electrode 11 and a lower electrode 14 are formed in pixel units, and the lower electrode 14 is connected to the conductive plug 44 in the semiconductor substrate 33 by metal wiring 55 that penetrates the transparent insulating film 51. The metal wiring 55 includes a material such as tungsten (W), aluminum (Al), or copper (Cu), for example.

A high refractive index layer 56 is formed with an inorganic film such as a silicon nitride film (SiN), a silicon oxynitride film (SiON), or silicon carbide (SiC) on an upper surface of the upper electrode 11. Further, an on-chip lens 57 is formed on the high refractive index layer 56. As the material for the on-chip lens 57, a silicon nitride film (SiN), or a resin material such as a styrene resin, an acrylic resin, a styrene-acrylic copolymer resin, or a siloxane resin, is used, for example. The high refractive index layer 56 and the on-chip lens 57 can include the same material.

The solid state image sensor 31 configured as described above is a back-illuminated CMOS solid state image sensor on which light is incident from the back side opposite to the front side of the semiconductor substrate 33.

Since the above-described photoelectric conversion element 1 is provided as a part of the photoelectric conversion portion of the solid state image sensor 31, the quantum efficiency can be improved in photoelectric conversion for photoelectrically converting the green wavelength light.

Note that the solid state image sensor 31 is a vertical spectral solid state image sensor that photoelectrically converts the green wavelength light in the photoelectric conversion element 1A formed outside the semiconductor substrate (silicon layer) 33, and photoelectrically converts the blue and red wavelength light in the photodiodes PD1 and PD2 in the semiconductor substrate 33. The photoelectric conversion element 1 can be used as a photoelectric conversion film of a solid state image sensor having a color filter of a Bayer array or the like formed on an upper side of the photoelectric conversion film, using a so-called panchromatic film having sensitivity to over the entire wavelength range of visible light, in place of the vertical spectral solid state image sensor. In this case, the photodiodes PD1 and PD2 in the semiconductor substrate 33 are not formed. Therefore, a metal such as aluminum, vanadium, gold, silver, platinum, iron, cobalt, carbon, nickel, tungsten, palladium, magnesium, calcium, tin, lead, titanium, yttrium, lithium, ruthenium, or manganese, and an alloy thereof can be used for the lower electrode 14, for example.

Further, in the example of FIG. 14, both the upper electrode 11 and the lower electrode 14 have been formed in pixel units. However, at least one of the upper electrode 11 and the lower electrode 14 may just be formed in pixel units.

Further, in the example of FIG. 14, the configuration of the photoelectric conversion element 1A of the first embodiment has been adopted as the photoelectric conversion element 1. However, any of the above-described photoelectric conversion elements 1A to 1E and its modifications may be adopted.

7. Method of Manufacturing Photoelectric Conversion Element

Next, a method of manufacturing the photoelectric conversion element 1A will be described with reference to FIGS. 15A, 15B, 15C, and 15D.

Figure 15A:
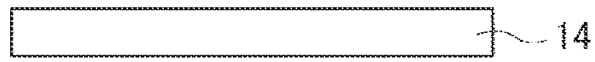
FIGS. 15A, 15B, 15C, and 15D are diagrams for describing a method of manufacturing the photoelectric conversion element of FIG. 1.

First, as illustrated in FIG. 15A, the lower electrode 14 serving as a lowermost layer in the photoelectric conversion element 1A is formed by patterning an ITO film in a desired region by lithography for example.

Figure 15B:
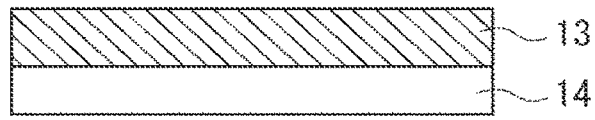

Next, as illustrated in FIG. 15B, the second photoelectric conversion layer 13 is formed on the lower electrode 14 by vacuum depositing three types of materials including the electron donating material, the electron accepting material, and the electron accepting impurities. Here, the impurity density of the electron accepting impurities is 1e16/cm3 or more, as described above, and favorably 1e17/cm4 and more favorably 1e18/cm3 or more.

Figure 15C:
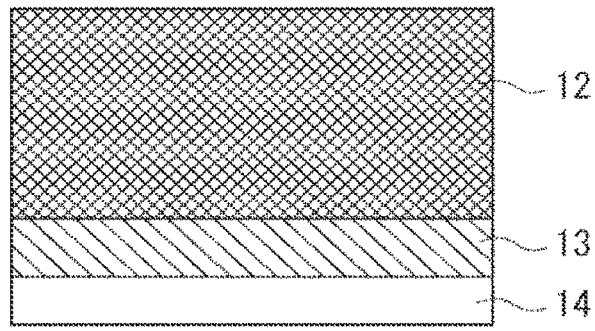

Next, as illustrated in FIG. 15C, the first photoelectric conversion layer 12 is formed on the second photoelectric conversion layer 13 by vacuum depositing the electron donating material and the electron accepting material, which are the same as the second photoelectric conversion layer 13.

Figure 15D:
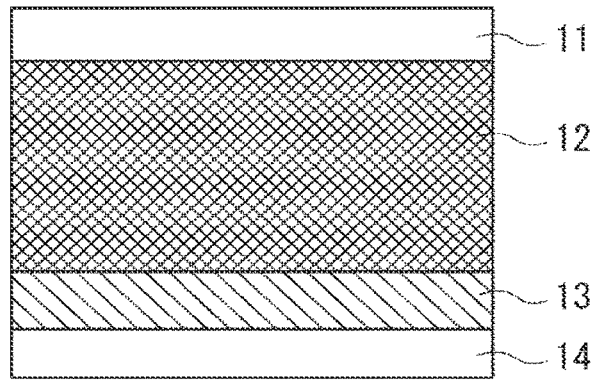

Finally, as illustrated in FIG. 15D, the first photoelectric conversion layer 12 is formed on the first photoelectric conversion layer 12 by forming the same type of ITO film as the lower electrode 14, for example.

As described above, the photoelectric conversion element 1A can be formed by laminating layers in order from the lower layer side. The photoelectric conversion elements 1B to 1E according to other embodiments can also be similarly manufactured.

Note that, in the above-described example, the first photoelectric conversion layer 12 and the second photoelectric conversion layer 13 are formed by vacuum deposition. However, the first photoelectric conversion layer 12 and the second photoelectric conversion layer 13 can be formed by a solution process. Further, the electron donating material and the electron accepting material used for the first photoelectric conversion layer 12 and the second photoelectric conversion layer 13 are the same materials. However, different materials may be used.

8. Application Examples to Electronic Devices

Application of the present technology is not limited to a solid state image sensor. That is, the present technology is applicable to various electronic devices using a solid state image sensor as an image capturing unit (photoelectric conversion portion), such as an imaging device like as a digital still camera or a video camera, a portable terminal device having an imaging function, or a copying machine using a solid state image sensor as an image reading unit. The solid state image sensor may be in a form formed as a single chip, or may be in a modular form having an imaging function, in which an imaging unit and a signal processing unit or an optical system are collectively packaged.

Figure 16:
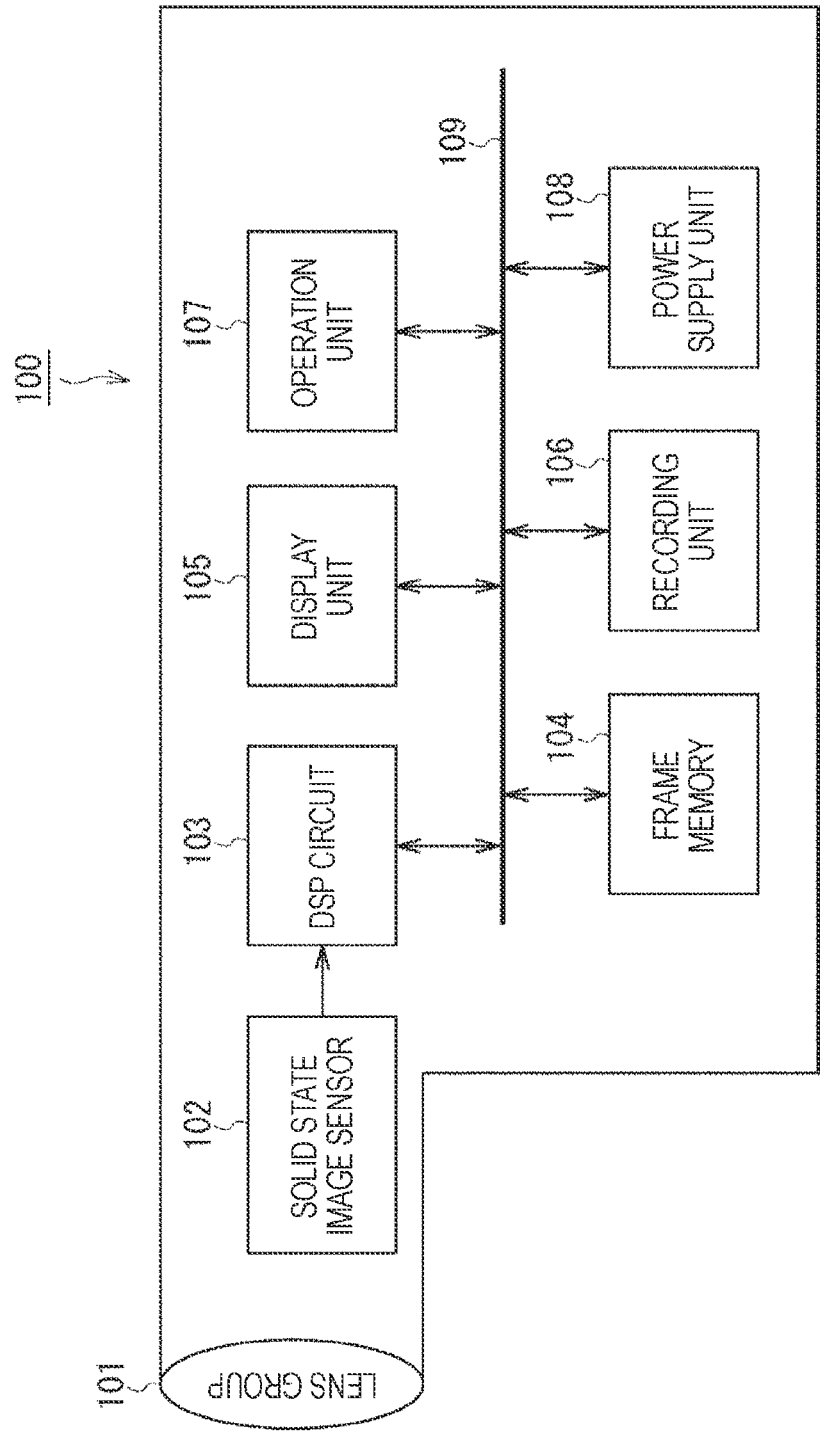
FIG. 16 is a block diagram illustrating a configuration example of an imaging device as an electronic device to which the present technology is applied.

FIG. 16 is a block diagram illustrating a configuration example of an imaging device as an electronic device to which the present technology is applied.

An imaging device 100 in FIG. 16 includes an optical unit 101 including a lens group and the like, a solid state image sensor (imaging device) 102 in which the configuration of the solid state image sensor 31 in FIG. 14 is employed, and a digital signal processor (DSP) circuit 103. Further, the imaging device 100 also includes a frame memory 104, a display unit 105, a recording unit 106, an operation unit 107, and a power supply unit 108. The DSP circuit 103, the frame memory 104, the display unit 105, the recording unit 106, the operation unit 107, and the power supply unit 108 are mutually connected via a bus line 109.

The optical unit 101 takes in incident light (image light) from an object and forms an image on an imaging plane of the solid state image sensor 102. The solid state image sensor 102 converts the light amount of the incident light imaged on the imaging plane by the optical unit 101 into an electrical signal in pixel units and outputs the electrical signal as a pixel signal. As the solid state image sensor 102, the solid state image sensor 31 in FIG. 14, that is, the solid state image sensor having the photoelectric conversion element 1 that improves the quantum efficiency and suppresses the dark current can be used.

The display unit 105 includes a panel-type display device such as a liquid crystal panel or an organic electro luminescence (EL) panel, for example, and displays a moving image or a still image imaged by the solid state image sensor 102. The recording unit 106 records the moving image or the still image imaged by the solid state image sensor 102 on a recording medium such as a hard disk or a semiconductor memory.

The operation unit 107 issues operation commands about various functions held by the imaging device 100 under an operation by a user. The power supply unit 108 appropriately supplies various power supplies serving as operating power sources of the DSP circuit 103, the frame memory 104, the display unit 105, the recording unit 106, and the operation unit 107 to these supply targets.

As described above, high sensitivity can be realized by using the solid state image sensor 31 including the above-described photoelectric conversion element 1 as the solid state image sensor 102. Therefore, high image quality of captured images can be achieved even in the imaging device 100 such as a video camera, a digital still camera, or a camera module for a mobile device such as a mobile phone.

<Usage Examples of Image Sensor>

Figure 17:
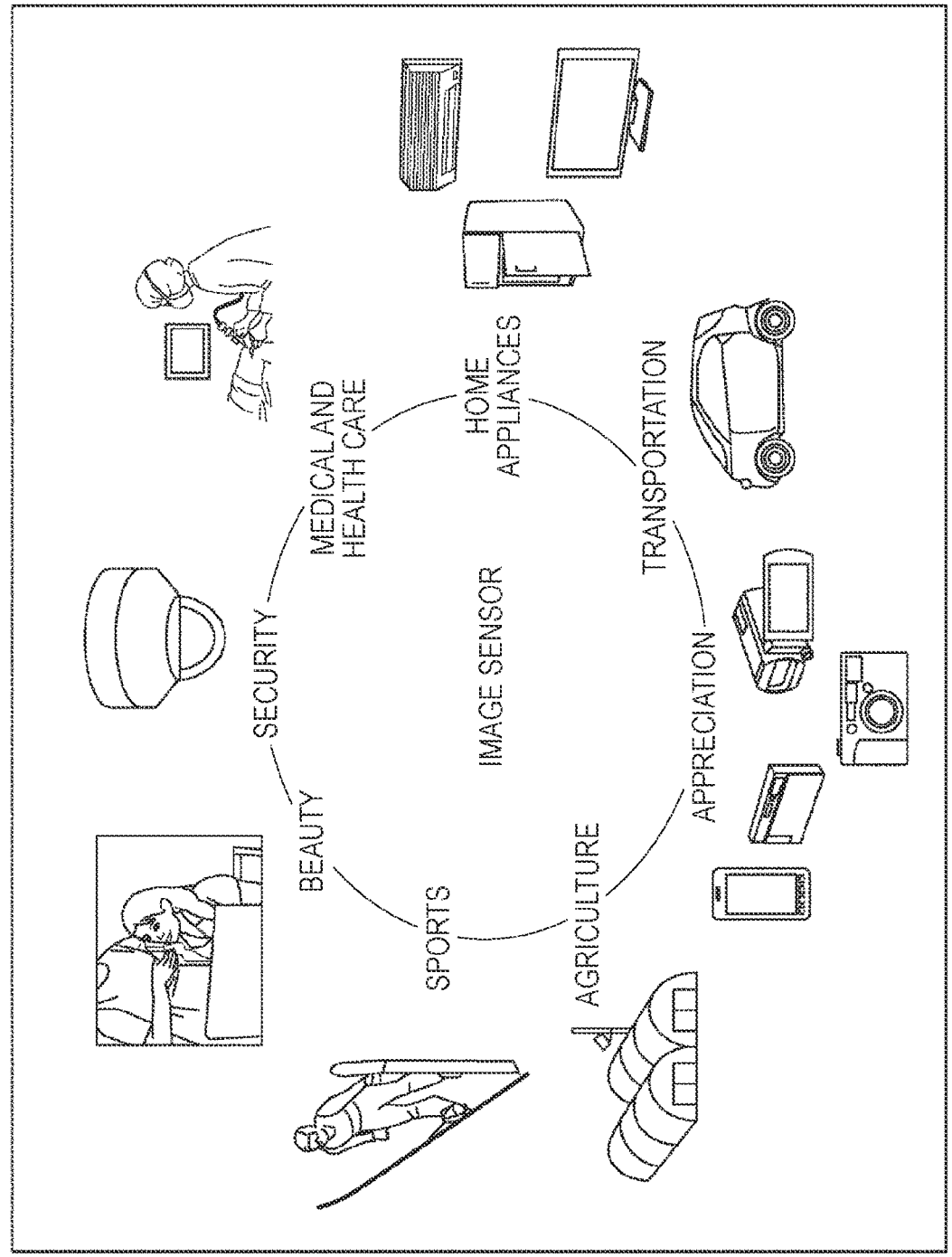
FIG. 17 is a diagram illustrating use examples of an image sensor to which the present technology is applied.

FIG. 17 is a diagram illustrating use examples of a case in which the above-described solid state image sensor 31 as an image sensor.

The image sensor can be used in various cases of sensing light such as visible light, infrared light, ultraviolet light, and an X-rays, for example as follows.

- A device that captures an image provided for appreciation use, such as a digital camera or a mobile device with a camera function
- A device provided for traffic use, such as an in-vehicle sensor that captures the front and the rear, surroundings, an interior and the like of an automobile, a monitoring camera that monitors traveling vehicles and roads, or a distance measuring sensor that measures a distance between vehicles and the like, for safe driving such as automatic stop, recognition of a state of a driver and the like
- Devices provided for home appliances such as TVs, refrigerators, air conditioners, etc. to capture gestures of users and perform device operations according to the gestures
- Devices provided for medical and healthcare, such as endoscopes and devices that perform angiography by receiving infrared light
- Devices provided for security, such as monitoring cameras for crime prevention and cameras for person authentication use
- Devices for beauty, such as skin measuring instruments that captures skin and microscopes that captures scalp
- Devices provided for sports, such as action cameras and wearable cameras for sport use or the like
- Devices provided for agriculture, such as cameras for monitoring the condition of fields and crops Embodiments of the present technology are not limited to the above-described embodiments, and various modifications can be made without departing from the gist of the present technology.

The photoelectric conversion element 1 is not limited to the photoelectric conversion portion of the solid state image sensor, and can also be used as a solar cell. In the case of using the photoelectric conversion element 1 as a solar cell, a metal such as aluminum, vanadium, gold, silver, platinum, iron, cobalt, carbon, nickel, tungsten, palladium, magnesium, calcium, tin, lead, titanium, yttrium, lithium, ruthenium, or manganese, and an alloy thereof, for example, can be used for the material of the upper electrode 11 or the lower electrode 14, which is not on a light incident side. Further, the solar cell using the photoelectric conversion element 1 can be used as a power source of an electronic device such as a watch, a mobile phone, or a mobile personal computer.

Further, the above-described embodiment has the configuration in which the first photoelectric conversion layer 12 not doped with impurities, and the second photoelectric conversion layer 13 doped with the electron accepting impurities or the third photoelectric conversion layer 15 doped with the electron donating impurities are separated in two layers with uniform film thicknesses. However, the boundary between the first photoelectric conversion layer 12 and the second photoelectric conversion layer 13 or the third photoelectric conversion layer 15 may not be a flat surface. In other words, in the photoelectric conversion element 1A according to the first embodiment, in a case where the first photoelectric conversion layer 12 and the second photoelectric conversion layer 13 are regarded as one photoelectric conversion layer, the photoelectric conversion layer (the second photoelectric conversion layer 13) containing the electron accepting impurities may just be formed on the side of the lower electrode 14 that is the cathode, and the photoelectric conversion layer (the first photoelectric conversion layer 12) without containing the electron accepting impurities may just be formed on the side of the upper electrode 11 that is the anode. In the photoelectric conversion element 1B according to the second embodiment, in a case where the first photoelectric conversion layer 12 and the third photoelectric conversion layer 15 are regarded as one photoelectric conversion layer, the photoelectric conversion layer (the third photoelectric conversion layer 15) containing the electron donating impurities may just be formed on the side of the upper electrode 11 that is the anode, and the photoelectric conversion layer (the first photoelectric conversion layer 12) without containing the electron donating impurities may just be formed on the side of the lower electrode 14 that is the cathode. The same applies to the third to fifth embodiments.

In the above-described embodiments, the materials exemplified as the materials for the layers and electrodes constituting the photoelectric conversion element 1 are merely examples and are not limited only to the materials described in the specification.

In the above-described configuration example of the solid state image sensor 31, the solid state image sensor in which the first conductivity type is the P type and the second conductivity type is the N type, and the electrons are regarded as the signal charges has been described. However, the present technology can also be applied to a solid state image sensor in which the holes are regarded as the signal charges. That is, the above-described semiconductor regions can be constituted by opposite conductivity-type semiconductor regions in which the first conductivity type is the N type and the second conductivity type is the P type.

Further, application of the present technology is not limited to the solid state image sensor that detects distribution of the amount of incident light of visible light and images the distribution an image, but also to a solid state image sensor that images distribution of an incident amount of infrared rays, X rays, particles or the like as an image or to various solid state image sensors (physical amount distribution detection devices) such as a fingerprint detection sensor that detects distribution of another physical amount such as a pressure or an electrostatic capacity in a broad sense and images the distribution as an image.

A form of a combination of all or a part of the above-described plurality of embodiments can be employed.

Note that the effects described in the present specification are merely examples and there may be effects other than the effects described in the present specification.

Note that the present technology can also have the following configurations.

(1)
A photoelectric conversion element including:
two electrodes constituting an anode and a cathode; and
a photoelectric conversion layer arranged between the two electrodes, in which
at least one electrode side of the two electrodes is doped with an impurity at impurity density of 1e16/cm3 or more in the photoelectric conversion layer.

(2)
The photoelectric conversion element according to (1), in which
an electrode side serving as the cathode is doped with the impurity exhibiting an electron accepting property.

(3)
The photoelectric conversion element according to (1), in which
an electrode side serving as the anode is doped with the impurity exhibiting an electron donating property.

(4)
The photoelectric conversion element according to (1), in which
an electrode side serving as the cathode is doped with the impurity exhibiting an electron accepting property, and an electrode side serving as the anode is doped with the impurity exhibiting an electron donating property.

(5)
The photoelectric conversion element according to (1), (2), or (4), further including:
a hole blocking layer between the electrode serving as the anode and the photoelectric conversion layer.

(6)
The photoelectric conversion element according to (1), (3), or (4), further including:
an electron blocking layer between the electrode serving as the cathode and the photoelectric conversion layer.

(7)
The photoelectric conversion element according to any one of (1) to (6), in which the impurity density is 1e17/cm4 or more.

(8)
The photoelectric conversion element according to (7), in which the impurity density is 1e18/cm3 or more.

(9)
A method of manufacturing a photoelectric conversion element, the method including:
forming two electrodes constituting an anode and a cathode, and
a photoelectric conversion layer arranged between the two electrodes; and
doping at least one electrode side of the two electrodes with an impurity at impurity density of 1e16/cm3 or more in forming the photoelectric conversion layer.

(10)
A solid state image sensor including:
a photoelectric conversion element including
two electrodes constituting an anode and a cathode, and
a photoelectric conversion layer arranged between the two electrodes, and
at least one electrode side of the two electrodes being doped with an impurity at impurity density of 1e16/cm3 or more in the photoelectric conversion layer.

(11)
An electronic device including:
a photoelectric conversion element including
two electrodes constituting an anode and a cathode, and
a photoelectric conversion layer arranged between the two electrodes, and
at least one electrode side of the two electrodes being doped with an impurity at impurity density of 1e16/cm3 or more in the photoelectric conversion layer.

(12)
A solar cell including:
a photoelectric conversion element including
two electrodes constituting an anode and a cathode, and
a photoelectric conversion layer arranged between the two electrodes, and
at least one electrode side of the two electrodes being doped with an impurity at impurity density of 1e16/cm3 or more in the photoelectric conversion layer.

REFERENCE SIGNS LIST 1A to 1E Photoelectric conversion element
11 Upper electrode
12 First photoelectric conversion layer
13 Second photoelectric conversion layer
14 Lower electrode
15 Third photoelectric conversion layer
21 Hole blocking layer
22 Electron blocking layer
31 Solid state image sensor
100 Imaging device
102 Solid state image sensor

What is claimed is:
1. A photoelectric conversion element, comprising:
a first electrode configured to collect holes;
a second electrode configured to collect electrons;
a first photoelectric conversion layer between the first electrode and the second electrode;
a second photoelectric conversion layer between the first photoelectric conversion layer and the first electrode; and a third photoelectric conversion layer between the first photoelectric conversion layer and the second electrode, wherein
  each of the first photoelectric conversion layer, second photoelectric conversion layer, and the third photoelectric conversion layer comprises an electron donating material and an electron accepting material,
  the second photoelectric conversion layer is doped with an electron accepting impurity, different from the electron accepting material, exhibiting an electron accepting property at an impurity density of at least 1e16/cm3, and
  the third photoelectric conversion layer is doped with an electron donating impurity, different from the electron donating material, exhibiting an electron donating property at an impurity density of at least 1e16/cm3.

2. The photoelectric conversion element according to claim 1, wherein
  the second photoelectric conversion layer is doped with the electron accepting impurity exhibiting the electron accepting property at an impurity density of at least 1e17/cm3, and
  the third photoelectric conversion layer is doped with the electron donating impurity exhibiting the electron donating property at an impurity density of at least 1e17/cm3.

3. The photoelectric conversion element according to claim 1, wherein the first electrode serves as a cathode.

4. The photoelectric conversion element according to claim 1, wherein the second electrode serves as an anode.

5. The photoelectric conversion element according to claim 1, wherein the second electrode has a potential higher than a potential of the first electrode.

6. The photoelectric conversion element according to claim 1, further comprising a hole blocking layer between the second electrode and the third photoelectric conversion layer.

7. The photoelectric conversion element according to claim 6, wherein a thickness of the hole blocking layer is between 10 nm and 200 nm.

8. The photoelectric conversion element according to claim 1, further comprising an electron blocking layer between the first electrode and the second photoelectric conversion layer.

9. The photoelectric conversion element according to claim 8, wherein a thickness of the electron blocking layer is between 10 nm and 200 nm.

10. The photoelectric conversion element according to claim 1, wherein the first electrode, the first photoelectric conversion layer, the second photoelectric conversion layer, the third photoelectric conversion layer, and the second electrode are laminated.

11. A solid state image sensor, comprising:
  a photoelectric conversion element comprising:
    a first electrode configured to collect holes;
    a second electrode configured to collect electrons;
    a first photoelectric conversion layer between the first electrode and the second electrode;
    a second photoelectric conversion layer between the first photoelectric conversion layer and the first electrode; and
    a third photoelectric conversion layer between the first photoelectric conversion layer and the second electrode, wherein
      each of the first photoelectric conversion layer, second photoelectric conversion layer, and the third photoelectric conversion layer comprises an electron donating material and an electron accepting material,
      the second photoelectric conversion layer is doped with an electron accepting impurity, different from the electron accepting material, exhibiting an electron accepting property at an impurity density of at least 1e16/cm3, and
      the third photoelectric conversion layer is doped with an electron donating impurity, different from the electron donating material, exhibiting an electron donating property at an impurity density of at least 1e16/cm3.

* * * * *